US009484927B2

(12) United States Patent
Aiko et al.

(10) Patent No.: US 9,484,927 B2
(45) Date of Patent: Nov. 1, 2016

(54) SEMICONDUCTOR DEVICE AND AUTOMOBILE

(71) Applicants: Mitsunori Aiko, Tokyo (JP); Shintaro Araki, Tokyo (JP)

(72) Inventors: Mitsunori Aiko, Tokyo (JP); Shintaro Araki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/653,822

(22) PCT Filed: Dec. 28, 2012

(86) PCT No.: PCT/JP2012/084153
§ 371 (c)(1),
(2) Date: Jun. 18, 2015

(87) PCT Pub. No.: WO2014/103036
PCT Pub. Date: Jul. 3, 2014

(65) Prior Publication Data
US 2015/0333757 A1 Nov. 19, 2015

(51) Int. Cl.
*H03L 1/02* (2006.01)
*H01L 23/34* (2006.01)
(Continued)

(52) U.S. Cl.
CPC .............. *H03L 1/022* (2013.01); *H01L 23/34* (2013.01); *H01L 23/58* (2013.01); *H01L 25/07* (2013.01);
(Continued)

(58) Field of Classification Search
CPC ... G05F 3/30; H02M 2001/327; H03L 1/022
See application file for complete search history.

(56) References Cited

U.S. PATENT DOCUMENTS

| | | | | |
|---|---|---|---|---|
| 6,061,221 A | * | 5/2000 | Tihanyi | H03K 17/0822 307/117 |
| 6,100,728 A | * | 8/2000 | Shreve | H03K 17/0826 327/110 |

(Continued)

FOREIGN PATENT DOCUMENTS

| | | |
|---|---|---|
| JP | S61-039561 A | 2/1986 |
| JP | H04-196472 A | 7/1992 |

(Continued)

OTHER PUBLICATIONS

International Search Report; PCT/JP2012/084153; Mar. 26, 2013.
(Continued)

*Primary Examiner* — Jeffrey Zweizig
(74) *Attorney, Agent, or Firm* — Studebaker & Brackett PC

(57) ABSTRACT

A semiconductor device includes a semiconductor element having a gate and controlled with a gate voltage, a gate drive circuit which controls the gate voltage, an electrode connected to the semiconductor element, a principal current in the semiconductor element flowing through the electrode, a temperature sensing part which senses the temperature of the electrode, a generation section which generates, on the basis of the temperature sensed by the temperature sensing part, a first control signal for giving a maximum amount of energization to the semiconductor element in such a range that the temperature of the electrode does not exceed a predetermined temperature, and a comparison section which compares the first control signal and a second control signal transmitted from the outside for the purpose of controlling the gate voltage, and selects a selective control signal which is one of the control signals with which the temperature of the electrode can be limited. The gate drive circuit controls the gate voltage according to the selective control signal.

8 Claims, 4 Drawing Sheets

(51) Int. Cl.
*H01L 25/07* (2006.01)
*H01L 23/58* (2006.01)
H01L 23/00 (2006.01)
H01L 25/18 (2006.01)

(52) U.S. Cl.
CPC ............ *H01L 25/072* (2013.01); *H01L 24/06* (2013.01); *H01L 24/29* (2013.01); *H01L 24/32* (2013.01); *H01L 24/40* (2013.01); *H01L 24/48* (2013.01); *H01L 24/73* (2013.01); *H01L 25/18* (2013.01); *H01L 2224/04026* (2013.01); *H01L 2224/04034* (2013.01); *H01L 2224/04042* (2013.01); *H01L 2224/06181* (2013.01); *H01L 2224/291* (2013.01); *H01L 2224/32225* (2013.01); *H01L 2224/40137* (2013.01); *H01L 2224/48091* (2013.01); *H01L 2224/48247* (2013.01); *H01L 2224/73221* (2013.01); *H01L 2224/73263* (2013.01); *H01L 2924/014* (2013.01); *H01L 2924/13055* (2013.01); *H01L 2924/13091* (2013.01); *H01L 2924/181* (2013.01)

(56) References Cited

U.S. PATENT DOCUMENTS

| | | | | |
|---|---|---|---|---|
| 6,791,063 B2* | 9/2004 | Manthe | ............... | B23K 9/1056 219/130.21 |
| 7,579,900 B2* | 8/2009 | Durbaum | ........... | H03K 17/0822 327/404 |
| 7,978,471 B2* | 7/2011 | Tokuyama | ............. | H01L 23/36 165/104.33 |
| 8,057,094 B2* | 11/2011 | Luniewski | ............. | H01L 23/34 257/467 |
| 8,456,220 B2* | 6/2013 | Thome | ................... | H01J 37/32 327/419 |
| 8,582,335 B2* | 11/2013 | Hasegawa | ............... | B60L 3/003 363/132 |
| 8,873,645 B2* | 10/2014 | Hamanaka | ............. | H02P 27/06 375/250 |
| 8,929,761 B2* | 1/2015 | Wakide | ................ | G03G 15/205 219/216 |
| 2005/0197799 A1 | 9/2005 | Kamezawa et al. | | |
| 2006/0055056 A1 | 3/2006 | Miura et al. | | |

FOREIGN PATENT DOCUMENTS

| | | |
|---|---|---|
| JP | H06-112425 A | 4/1994 |
| JP | H07-014948 A | 1/1995 |
| JP | 2002-110866 A | 4/2002 |
| JP | 2005-252090 A | 9/2005 |
| JP | 2005-268496 A | 9/2005 |
| JP | 2008-124199 A | 5/2008 |
| JP | 2009-254158 A | 10/2009 |
| JP | 2010-081796 A | 4/2010 |

OTHER PUBLICATIONS

Written Opinion of the International Searching Authority; PCT/JP2012/084153; Mar. 26, 2013.
Notification of Transmittal of Translation of the International Preliminary Report on Patentability and Translation of Written Opinion of the International Searching Authority; PCT/JP2012/084153; issued on Jul. 9, 2015.
An Office Action; "Notification of Reason for Rejection," issued by the Japanese Patent Office on Mar. 15, 2016, which corresponds to Japanese Patent Application No. 2014-554025 and is related to U.S. Appl. No. 14/653,822; with English language partial translation.
An Office Action issued by the Japanese Patent Office on Sep. 20, 2016, which corresponds to Japanese Patent Application No. 2014-554025 and is related to U.S. Appl. No. 14/653,822; with English language partial translation.

* cited by examiner

… (1) …

SEMICONDUCTOR DEVICE AND AUTOMOBILE

TECHNICAL FIELD

This present invention relates to a semiconductor device used for high-voltage large-current switching or the like and to an automobile provided with the semiconductor device.

BACKGROUND ART

Patent Literature 1 discloses a power semiconductor module having a semiconductor element, a collector electrode, an emitter electrode and a gate electrode junctioned to an insulating substrate with solder or the like. In this power semiconductor module, the temperatures of the semiconductor element and the component parts are measured with thermocouples, and degradation of the junction interface and the condition of cooling of a device are grasped from the measured changes in temperature. If a crack occurs and grows in the junction interface, the heat resistance increases and an increase in temperature occurs. Therefore, the progress of cracking can be determined by measuring the rate of increase in temperature.

PRIOR ART

Patent Literature

Patent Literature 1: Japanese Patent Laid-Open No. H07-014948

SUMMARY OF INVENTION

Technical Problem

In the arrangement disclosed in Patent Literature 1, there is a possibility of the temperatures of the semiconductor element and the electrode becoming high. Heat dissipation from the semiconductor element can easily be achieved by attaching a heat sink or the like to the semiconductor element. However, heat dissipation from the electrode to which no heat sink is attached is not easy to achieve. Also, a great part of the electrode is covered with the resin in the semiconductor device. Therefore, heat accumulates easily in and around the electrode. There is, therefore, a problem that keeping the temperature of the electrode equal to or lower than a predetermined specified value requires increasing the size of the electrode.

The present invention has been achieved to solve the above-described problem, and an object of the present invention is to provide a semiconductor device in which the size of an electrode can be reduced while the temperature of the electrode is kept equal to or lower than a specified value, and an automobile including the semiconductor device.

Means for Solving the Problems

A semiconductor device according to the present invention includes a semiconductor element having a gate and controlled with a gate voltage, a gate drive circuit which controls the gate voltage, an electrode connected to the semiconductor element, a principal current in the semiconductor element flowing through the electrode, a temperature sensing part which senses the temperature of the electrode, a generation section which generates, on the basis of the temperature sensed by the temperature sensing part, a first control signal for giving a maximum amount of energization to the semiconductor element in such a range that the temperature of the electrode does not exceed a predetermined temperature, and a comparison section which compares the first control signal and a second control signal transmitted from the outside for the purpose of controlling the gate voltage, and selects a selective control signal which is one of the control signals with which the temperature of the electrode can be limited, wherein the gate drive circuit controls the gate voltage according to the selective control signal.

Other features of the present invention will be made clear by the following description.

Advantageous Effects of Invention

According to the present invention, the control signal is changed on the basis of the detected temperature of the electrode temperature so that the electrode temperature does not exceed a specified value. Therefore, the size of the electrode can be reduced while the temperature of the electrode is kept equal to or lower than the specified value.

DESCRIPTION OF EMBODIMENTS

Figure 1:
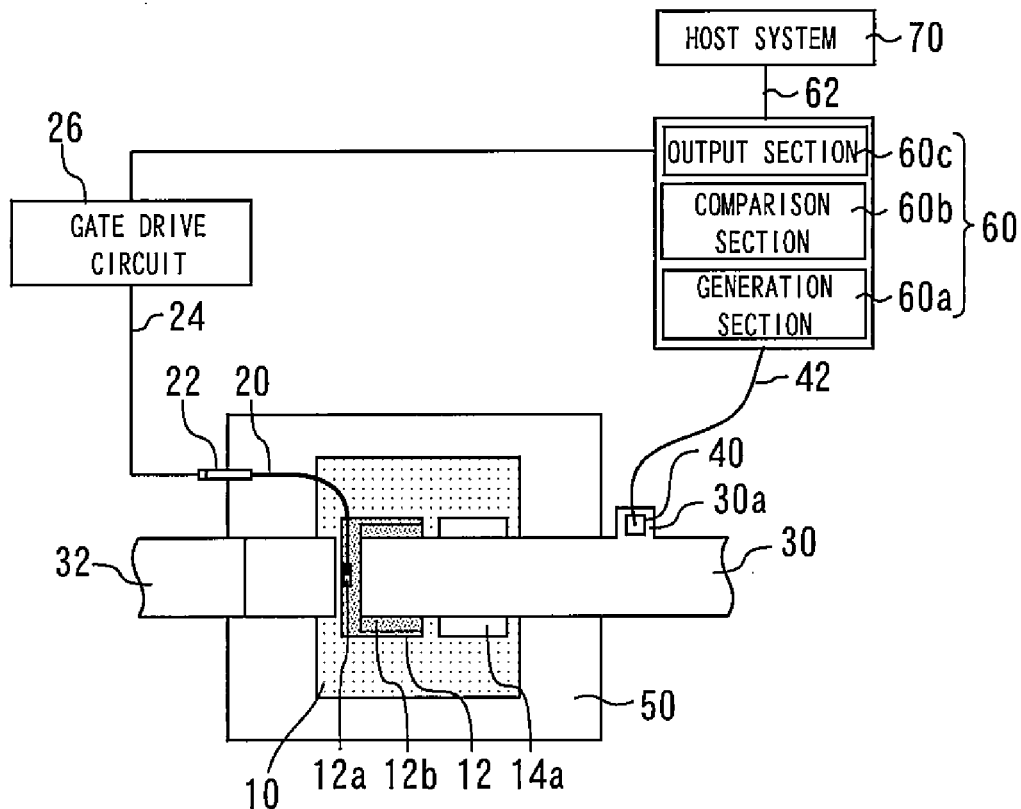
FIG. 1 is a diagram of a semiconductor device according to Embodiment 1 of the present invention.

Semiconductor devices according to embodiments of the present invention will be described with reference to the drawings. Components identical or corresponding to each other are indicated by the same reference characters, and repetition of description is avoided in some cases.

Embodiment 1

FIG. 1 is a diagram of a semiconductor device according to Embodiment 1 of the present invention. This semiconductor device is provided with a substrate 10. The substrate 10 is formed of a heat spreader for example. A semiconductor element 12 is fixed on the substrate 10 with solder for example. The semiconductor element 12 is formed of an IGBT having a gate 12a and an emitter 12b on its surface. A diode 14 which functions as a reflux diode is fixed by the side of the semiconductor element 12 on the substrate 10 with solder for example. The diode 14 has a surface electrode 14a.

A gate electrode 22 is connected to the gate 12a through a wire 20. The gate electrode 22 is connected to a gate drive circuit 26 through a wire 24. The gate drive circuit 26 is a component for controlling a gate voltage on the gate 12a. The semiconductor element 12 is controlled through this gate voltage.

An electrode 30 is fixed on the emitter 12b and the surface electrode 14a with solder for example. A principal current in the semiconductor element 12 flows through the electrode 30. The electrode 30 has a branch portion 30a branching off from a principal current path. A temperature sensing part 40 is attached to the branch portion 30a. The temperature sensing part 40 is formed of a thermocouple for sensing the temperature of the electrode 30. An electrode 32 is fixed on the substrate 10. The electrode 32 is electrically connected to a collector on the back surface of the semiconductor element 12 through the substrate 10.

The semiconductor element 12, the diode 14, the gate electrode 22 and the electrodes 30 and 32 are covered with a resin 50, with a portion of the gate electrode 22 and portions of the electrodes 30 and 32 exposed to the outside. The electrodes 30 and 32 are extended out of the resin 50 for connection to external bus bars. The above-described branch portion 30a and the temperature sensing part 40 are also exposed out of the resin 50.

A control unit 60 is connected to the temperature sensing part 40 through a wire 42. The control unit 60 is provided with a generation section 60a, a comparison section 60b and an output section 60c. The generation section 60a is a section which generates, on the basis of the temperature sensed by the temperature sensing part 40, a first control signal for giving a maximum amount of energization to the semiconductor element 12 in such a range that the temperature of the electrode 30 does not exceed a predetermined temperature (specified value). The control signal determines the time period for which the semiconductor element 12 is energized. For example, the control signal is a signal relating to the duty ratio and switching achieved with an arm.

A host system 70 is connected to the control unit 60 through a wire 62. The host system 70 is a unit which transmits to the control unit 60 a second control signal for controlling the gate voltage. The host system 70 is not necessarily included in the semiconductor device according to Embodiment 1 of the present invention. That is, if the control unit 60 can receive the signal from the "outside", the host system 70 is not indispensable. The same can be said with respect to embodiments described below. The comparison section 60b is a section which compares the first control signal and the second control signal and selects one of the control signals with which the temperature of the electrode 32 can be limited. The control signal selected by the comparison section 60b is called "selective control signal". The output section 60c is a section which transmits the selective control signal to the gate drive circuit 26.

Figure 2:
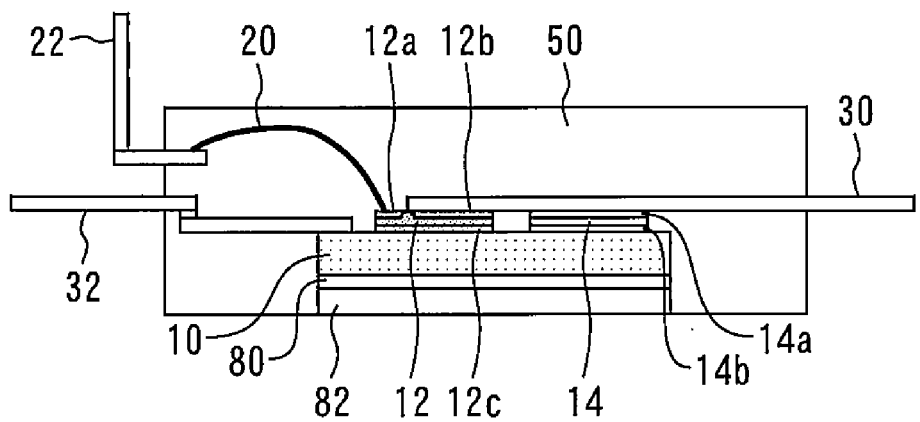
FIG. 2 is a sectional view showing portions inside the resin.

FIG. 2 is a sectional view showing portions inside the resin 50. The semiconductor element 12 has a collector 12c on its back surface. The diode 14 has a back electrode 14b on its back surface. The collector 12c and the back electrode 14b are fixed on the front surface of the substrate 10 with solder for example. An insulating sheet 80 is applied to the back surface of the substrate 10. Copper foil 82 is fixed on the back surface of the substrate 10, with the insulating sheet 80 interposed therebetween. It is preferable that a heat sink be fixed to the copper foil 82, for example, by soldering, ultrasonic joining, brazing, welding or bonding with an adhesive.

Figure 3:
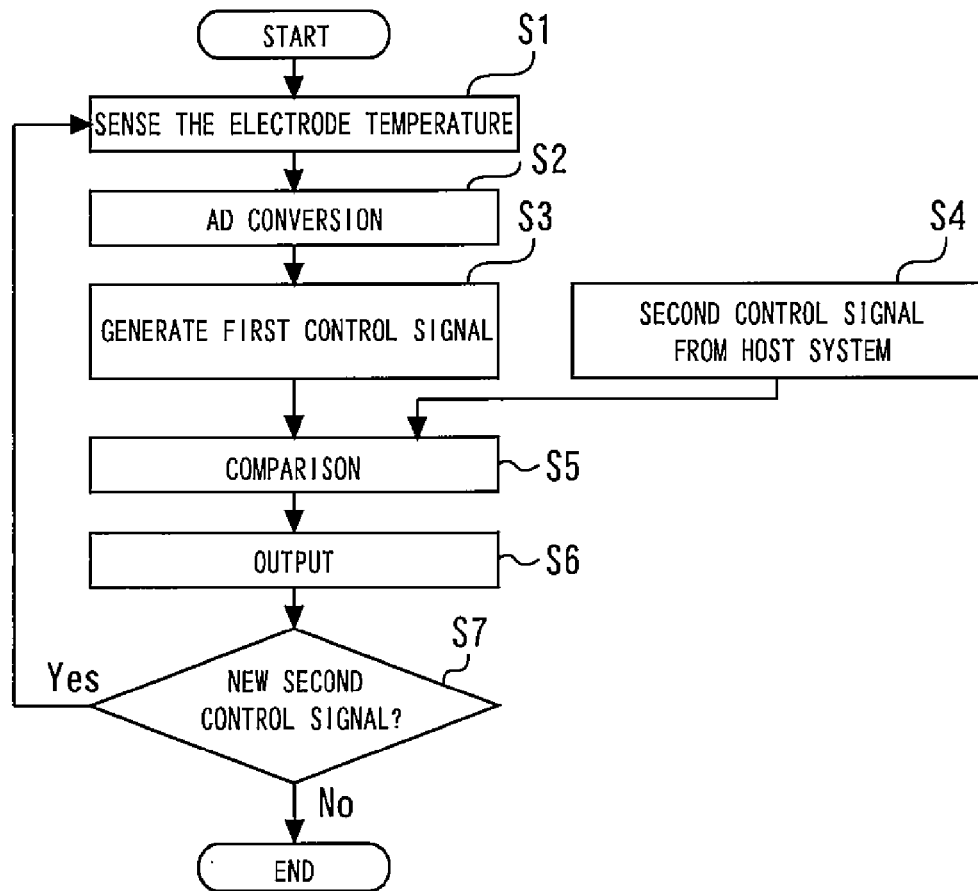
FIG. 3 is a flowchart showing the operation of the semiconductor device according to Embodiment 1 of the present invention.

The operation of the semiconductor device according to Embodiment 1 of the present invention will be described. FIG. 3 is a flowchart showing the operation of the semiconductor device according to Embodiment 1 of the present invention. First, the temperature of the electrode 30 is sensed by the temperature sensing part 40 (step S1). Since the temperature sensing part 40 is a thermocouple, thermoelectromotive force (voltage signal) is transmitted to the control unit 60 through the wire 42.

Next, the sensed temperature (thermoelectromotive force) is converted into a digital value by the generation section 60a (step S2). Subsequently, the generation section 60a generates the first control signal on the basis of digital value into which the thermoelectromotive force has been converted (step S3). The generation section 60a uses, for example, data on the shape of the electrode 30 stored in the generation section 60a (hereinafter referred to as a shape model) for the calculation of the first control signal. Parameters included in the shape model are, for example, the thickness of the substrate 10 and the thickness, width and length of the electrode 30. The first control signal is a signal for giving the maximum amount of energization to the semiconductor element 12 in such a range that the temperature of the electrode 30 does not exceed a specified value, as described above.

Subsequently, the comparison section 60b compares the first control signal and the second control signal and selects one of these control signals (selective control signal) with which the temperature of the electrode 32 can be limited (step S5). Subsequently, the output section 60c transmits this selective control signal to the gate drive circuit 26 (step S6). The gate drive circuit 26 then controls the gate voltage according to the selective control signal.

Subsequently, if a new second control signal has been issued, the above-described process steps are again executed. If no new control signal has been issued, the process ends (step S7). Such a sequence of operations is executed at least each time the second control signal sent from the host system 70 to the control unit 60. A more preferable operation is to continuously update the first control signal at all times by continuously sensing the temperature of the electrode 30 with the temperature sensing part 40 and to compare the latest first control signal and the second control signal.

In the semiconductor device according to Embodiment 1 of the present invention, the second control signal issued from the host system 70 is not adopted when it is a signal to increase the temperature of the electrode 30 above the specified value, and the semiconductor element 12 can be controlled with the first control signal in this case. Selecting not the second control signal but the first control signal is substantially equivalent to reducing the amount of energization with the second control signal. The temperature of the electrode 30 can thus be kept equal to or lower than the specified value. Since use of the small electrode 30 is presupposed in the present invention, setting the specified value with respect to the small electrode 30 enables preventing the temperature of the electrode from exceeding the specified value. Thus, the electrode can be reduced in size while the temperature of the electrode is kept equal to or lower than the specified value.

It is preferable that with the first control signal generated by the generation section 60a, the maximum amount of energization be given to the semiconductor element in such a range that the specified value is not exceeded in order that the desired control with the host system 70 should be ensured as extensively as possible. Therefore, the first control signal should be generated with accuracy. In the semiconductor device according to Embodiment 1 of the present invention, the accuracy with which the temperature of the electrode 30 is predicted is high since the first control signal is generated by using the shape model stored in the generation section 60a. The first control signal can therefore be generated with accuracy.

In Embodiment 1 of the present invention, the first control signal is generated by using a shape model. However, the present invention is not limited to this. For example, the generation section 60a may generate the first control signal by using map data in which the first control signal corresponding to the electrode temperature is stored. In such a case, the first control signal can be immediately generated from the electrode temperature by using map data without needing to calculate it, and the processing speed can therefore be increased.

Figure 4:
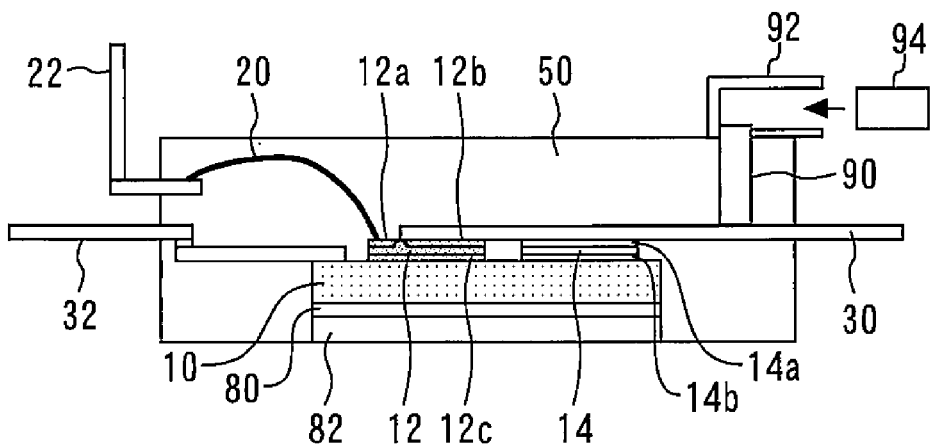
FIG. 4 is a sectional view showing an example of modification with respect to the position at which the temperature sensing part is mounted.

FIG. 4 is a sectional view showing an example of modification with respect to the position at which the temperature sensing part is mounted. The semiconductor device in this case is provided with a metal part 90 connected to the electrode 30 in the resin 50 and having its portion exposed out of the resin 50. The semiconductor device is also provided with a socket 92 having as a point of contact the portion of the metal part 90 exposed out of the resin 50. A temperature sensing part 94 has such a shape as to be capable of being inserted in the socket 92. This arrangement ensures that sensing of the temperature of the electrode 30 is enabled by only inserting the temperature sensing part 94 in the socket 92. The socket 92 may be removed and the temperature sensing part may be fixed on the metal part 90.

In the semiconductor device according to Embodiment 1 of the present invention, the temperature of the electrode through which the principal current in the semiconductor element 12 flows is measured. Therefore, the temperature sensing part may be attached to any portion of the electrode through which the principal current flows, which portion is not limited to the metal part 90 in the socket 92 or branch portion 30.

The temperature sensing part 40 is not limited to the thermocouple. Any other sensing part may suffice if it is capable of sensing temperature. For example, the temperature sensing part 40 may be formed of a thermal diode. The semiconductor element 12 is not particularly limited to the IGBT. Any other semiconductor element may suffice if it is on/off controlled through a gate voltage. For example, a power MOSFET may be used as semiconductor element 12. Each of the above-described modifications can be applied to embodiments described below.

Embodiment 2

Figure 5:
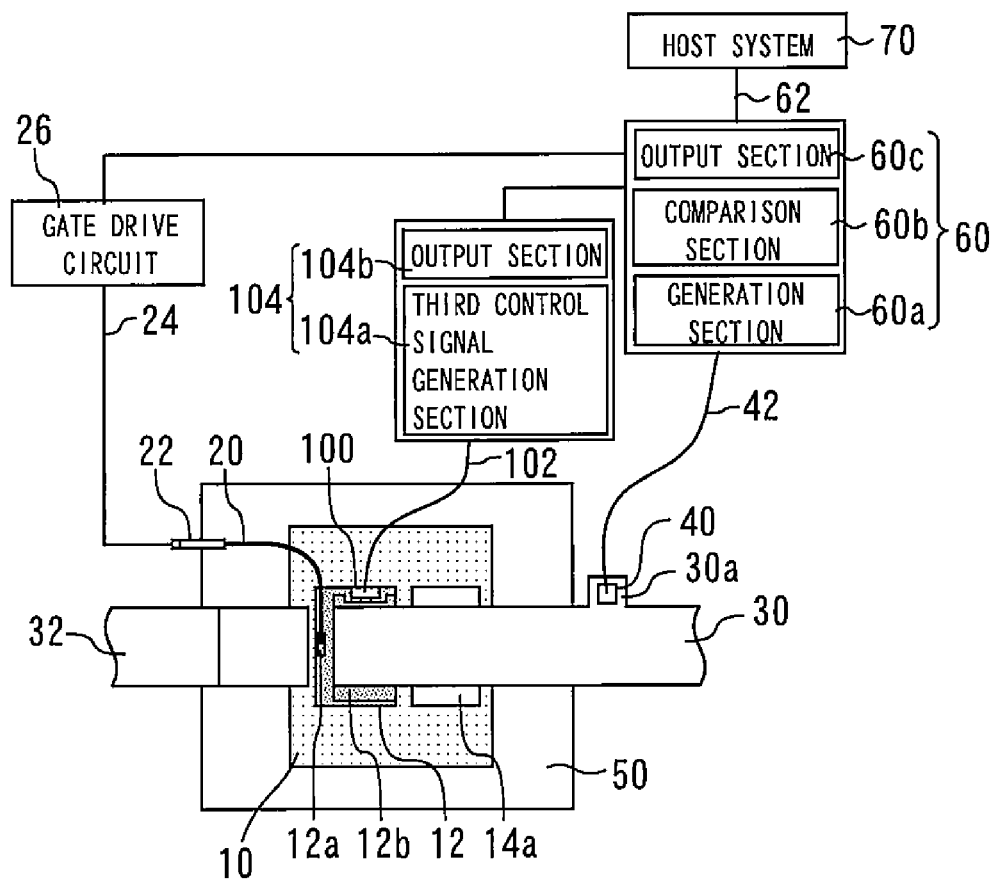
FIG. 5 is a diagram of the semiconductor device according to Embodiment 2 of the present invention.

A semiconductor device according to Embodiment 2 of the present invention corresponds in a number of respects to the semiconductor device according to Embodiment 1 and will therefore be described mainly with respect to points of difference from the semiconductor device according to Embodiment 1. FIG. 5 is a diagram of the semiconductor device according to Embodiment 2 of the present invention. In this semiconductor device, the temperature of the semiconductor element 12 is detected as well as that of the electrode 30.

An element temperature sensing part 100 is attached to a surface of the semiconductor element 12. The element temperature sensing part 100 is formed, for example, of a thermocouple. An element temperature monitoring unit 104 is connected to the element temperature sensing part 100 through a wire 102. The element temperature monitoring unit 104 is provided with a third control signal generation section 104a and an output section 104b. The third control signal generation section 104a is a section which generates, on the basis of the temperature sensed by the element temperature sensing part 100, a third control signal for giving a maximum amount of energization to the semiconductor element 12 in such a range that the temperature of the semiconductor element 12 does not exceed a predetermined temperature (element specified value). The output section 104b is a section which transmits the third control signal to the control unit 60.

The operation of the semiconductor device according to Embodiment 2 of the present invention will be described. The comparison section 60b compares the first control signal, the second control signal and the third control signal, and selects as a selective control signal one of these control signals with which the temperature of the electrode 32 can be limited most strongly. This selective control signal is also a control signal with which the temperature of the semiconductor element 12 can be limited most strongly.

The semiconductor device according to Embodiment 2 of the present invention is capable of controlling the semiconductor element 12 with the selective control signal so that the temperature of the semiconductor element 12 does not exceed the element specified value and the temperature of the electrode 30 does not exceed the specified value. Thus, the reliability of the semiconductor element 12 is ensured while the same advantages as those of Embodiment 1 are obtained.

Embodiment 3

Figure 6:
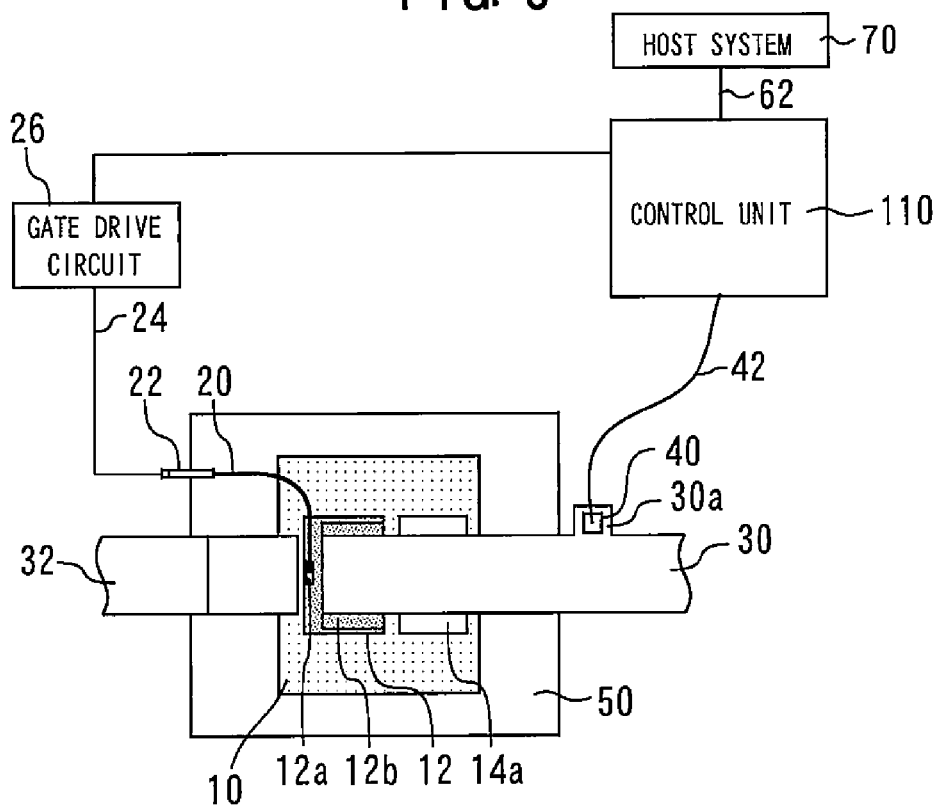
FIG. 6 is a diagram of the semiconductor device according to Embodiment 3 of the present invention.

A semiconductor device according to Embodiment 3 of the present invention corresponds in a number of respects to the semiconductor device according to Embodiment 1 and will therefore be described mainly with respect to points of difference from the semiconductor device according to Embodiment 1. FIG. 6 is a diagram of the semiconductor device according to Embodiment 3 of the present invention. The difference of this semiconductor from the corresponding one in Embodiment 1 resides in a control unit 110.

The control unit 110 changes, on the basis of the temperature sensed by the temperature sensing part 40, the content of the control signal transmitted from the host system 70 for control of the gate voltage so that the temperature of the electrode 30 does not exceed a predetermined temperature (specified value). This changing is performed when the control signal transmitted from the host system 70 to the control unit 110 is such as to increase the temperature of the electrode above the specified value. More specifically, a change to be made is, for example, a decrease in energization current to the semiconductor element 12 or a reduction in the time period during which the semiconductor element 12 is energized (signal width). The amount of this reduction is increased if the temperature sensed by the temperature sensing part 40 is higher. The gate drive circuit 26 controls the gate voltage according to the control signal changed as required by the control unit 110.

The semiconductor device according to Embodiment 3 of the present invention uses as a basis for control the control signal transmitted from the host system 70 and makes a change in this control signal, thereby obtaining the same advantages as those of the semiconductor device in Embodiment 1 while simplifying the configuration of the control unit 110.

Embodiment 4

Figure 7:
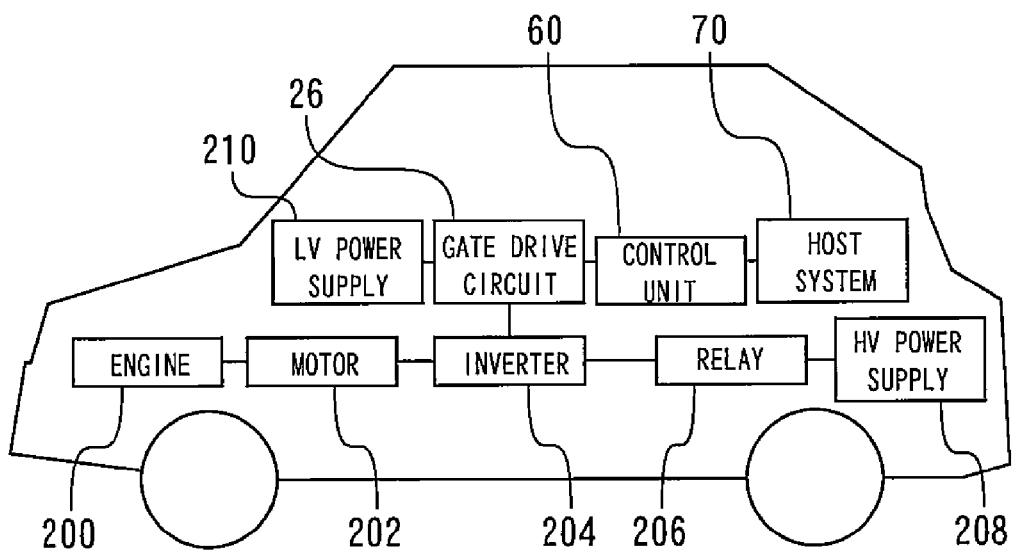
FIG. 7 is a diagram showing the automobile according to Embodiment 4 of the present invention.

Embodiment 4 of the present invention relates to an automobile. The automobile according to Embodiment 4 of the present invention includes the semiconductor device according to Embodiment 1. FIG. 7 is a diagram showing the automobile according to Embodiment 4 of the present invention. This automobile is a hybrid vehicle which travels by using both or one of an engine 200 and a motor 202. The motor 202 is controlled with an inverter 204. The inverter 204 includes the semiconductor device described with reference to FIG. 1. More specifically, a three-phase alternating-current inverter is formed by arranging six semiconductor elements 12. The motor 202 is controlled with principal currents in the semiconductor elements included in the inverter 204.

A high voltage to the inverter 204 is supplied from a high-voltage power supply 208 through a relay 206, while a low voltage to a gate drive circuit 26 is supplied from a low-voltage power supply 210.

Pattern of energization current of vehicle power modules include a pulse energization mode used for normal operation and a DC energization mode used at the time of motor locking. Semiconductor elements such as IGBTs are ordinarily designed so that generation of heat from the element is limited by a temperature sensing function. It is, therefore, easy to optimize the size of such semiconductor elements. On the other hand, if electrodes (electrodes 30 and 32 in FIG. 1) are designed on the basis of the DC current in the energization mode, increases in size of the electrodes cannot be avoided.

In the automobile according to Embodiment 4 of the present invention, the electrode temperature can be kept equal to or lower than the specified value by selecting the first control signal with the comparison section 60b in the control unit 60 when a large current flows, for example, in the DC energization mode, and, therefore, the electrodes can be reduced in size. Accordingly, the automobile can be reduced in size. The semiconductor device according to Embodiment 2 or 3 may be adopted for the automobile according to Embodiment 4 of the present invention.

DESCRIPTION OF SYMBOLS 10 substrate, 12 semiconductor element, 12a gate, 12b emitter, 12c collector, 14 diode, 14a surface electrode, 14b back electrode, 20,24,42,62 wire, 22 gate electrode, 26 gate drive circuit, 30, 32 electrode, 30a branch portion, 30 temperature sensing part, 50 resin, 60 control unit, 60a generation section, 60b comparison section, 60c output section, 70 host system, 80 insulating sheet, 82 copper foil, 90 metal part, 92 socket, 94 temperature sensing part, 100 element temperature sensing part, 104 element temperature monitoring unit, 104a third control signal generation section, 104b output section, 110 control unit, 200 engine, 202 motor, 204 inverter

The invention claimed is:

1. A semiconductor device comprising:
a semiconductor element having a gate and controlled with a gate voltage;
a gate drive circuit which controls the gate voltage;
an electrode connected to the semiconductor element, a principal current in the semiconductor element flowing through the electrode;
a temperature sensing part, in physical contact with the electrode, which senses the temperature of the electrode;
a generation section which generates, on the basis of the temperature sensed by the temperature sensing part, a first control signal for giving a maximum amount of energization to the semiconductor element in such a range that the temperature of the electrode does not exceed a predetermined temperature; and
a comparison section which compares the first control signal and a second control signal transmitted from the outside for the purpose of controlling the gate voltage, and selects a selective control signal which is one of the control signals with which the temperature of the electrode can be limited,
wherein the gate drive circuit controls the gate voltage according to the selective control signal.

2. The semiconductor device according to claim 1, wherein the generation section generates the first control signal by using a shape model of the electrode.

3. The semiconductor device according to claim 1, wherein the generation section generates the first control signal by using map data in which the first control signal corresponding to the temperature of the electrode is stored.

4. The semiconductor device according to claim 1, further comprising:
an element temperature sensing part attached to the semiconductor element; and
a third control signal generation section which generates, on the basis of the temperature sensed by the element temperature sensing part, a third control signal for giving a maximum amount of energization to the semiconductor element in such a range that the temperature of the semiconductor element does not exceed a predetermined temperature,
wherein the comparison section compares the first control signal, the second control signal and the third control signal.

5. The semiconductor device according to claim 1, wherein the electrode has a branch portion branching off from a main current path, and the temperature sensing part is attached to the branch portion.

6. A semiconductor device comprising:
a semiconductor element having a gate and controlled with a gate voltage;
a gate drive circuit which controls the gate voltage;
an electrode connected to the semiconductor element, a principal current in the semiconductor element flowing through the electrode;
a temperature sensing part, in direct contact with the electrode, which senses the temperature of the electrode; and
a control section which changes, on the basis of the temperature sensed by the temperature sensing part, the content of a control signal transmitted from the outside for control of the gate voltage so that the temperature of the electrode does not exceed a predetermined temperature,
wherein the gate drive circuit controls the gate voltage according to the control signal changed by the control section.

7. A semiconductor device comprising:
a semiconductor element having a gate and controlled with a gate voltage;
a gate drive circuit which controls the gate voltage;
an electrode connected to the semiconductor element, a principal current in the semiconductor element flowing through the electrode;
a temperature sensing part which senses the temperature of the electrode;
a generation section which generates, on the basis of the temperature sensed by the temperature sensing part, a first control signal for giving a maximum amount of energization to the semiconductor element in such a range that the temperature of the electrode does not exceed a predetermined temperature;

a resin which covers the semiconductor element and the electrode so that a portion of the electrode is exposed out of the resin;

a metal part connected to the electrode in the resin and having its portion exposed out of the resin;

a socket having as a point of contact the portion of the metal part exposed out of the resin; and a comparison section which compares the first control signal and a second control signal transmitted from the outside for the purpose of controlling the gate voltage, and selects a selective control signal which is one of the control signals with which the temperature of the electrode can be limited, wherein the gate drive circuit controls the gate voltage according to the selective control signal, and the temperature sensing part has such a shape as to be capable of being inserted in the socket.

8. An automobile comprising:

a semiconductor device having a semiconductor element having a gate and controlled with a gate voltage, a gate drive circuit which controls the gate voltage, an electrode connected to the semiconductor element, a principal current in the semiconductor element flowing through the electrode, a temperature sensing part, in direct contact with the electrode, which senses the temperature of the electrode, a generation section which generates, on the basis of the temperature sensed by the temperature sensing part, a first control signal for giving a maximum amount of energization to the semiconductor element in such a range that the temperature of the electrode does not exceed a predetermined temperature, and a comparison section which compares the first control signal and a second control signal transmitted from the outside for the purpose of controlling the gate voltage, and selects a selective control signal which is one of the control signals with which the temperature of the electrode can be limited, wherein the gate drive circuit controls the gate voltage according to the selective control signal.

* * * * *